US008896378B2

(12) United States Patent
Hirose et al.

(10) Patent No.: US 8,896,378 B2
(45) Date of Patent: Nov. 25, 2014

(54) DIFFERENTIAL AMPLIFIER CIRCUIT WITH ULTRALOW POWER CONSUMPTION PROVIDED WITH ADAPTIVE BIAS CURRENT GENERATOR CIRCUIT

(71) Applicant: Semiconductor Technology Academic Research Center, Kanagawa (JP)

(72) Inventors: Tetsuya Hirose, Hyogo (JP); Yuji Osaki, Hyogo (JP); Yumiko Tsuruya, Hyogo (JP); Osamu Kobayashi, Kanagawa (JP)

(73) Assignee: Semiconductor Technology Academic Research Center, Kanagawa (JP)

( * ) Notice: Subject to any disclaimer, the term of this patent is extended or adjusted under 35 U.S.C. 154(b) by 87 days.

(21) Appl. No.: 13/752,919

(22) Filed: Jan. 29, 2013

(65) Prior Publication Data

US 2013/0194039 A1     Aug. 1, 2013

(30) Foreign Application Priority Data

Jan. 30, 2012   (JP) .................. 2012-016887

(51) Int. Cl.
*H03F 3/45*     (2006.01)
*H03F 3/30*     (2006.01)
*H03F 1/02*     (2006.01)

(52) U.S. Cl.
CPC .. *H03F 3/45179* (2013.01); *H03F 2203/45626* (2013.01); *H03F 3/3028* (2013.01); *H03F 3/45183* (2013.01); *H03F 2203/45454* (2013.01); *H03F 2203/45244* (2013.01); *H03F 1/0261* (2013.01); *H03F 2203/30021* (2013.01)
USPC ....................................................... 330/259

(58) Field of Classification Search
USPC ................................. 330/259, 261
See application file for complete search history.

(56) References Cited

U.S. PATENT DOCUMENTS 7,042,289 B2 *  5/2006  Hwang et al. ................. 330/253
8,330,499 B2   12/2012  Hirose et al.

FOREIGN PATENT DOCUMENTS

JP     2010-239554     10/2010
JP     2011-182188     9/2011

OTHER PUBLICATIONS

Tetsuya Hirose et al., "A Nano-Ampere Current Reference Circuit and its Temperature Dependence Control by using Temperature Characteristics of Carrier Mobilities", Proceedings of the 36th European Solid-State Circuits Conference, pp. 114-117, Sep. 2010.
Marc G. Degrauwe et al., "Adaptive Biasing CMOS Amplifiers", IEEE Journal of Solid-State Circuits, vol. SC-17, No. 3, pp. 522-528, Jun. 1982.

* cited by examiner

*Primary Examiner* — Steven J Mottola
(74) *Attorney, Agent, or Firm* — Wenderoth, Lind & Ponack, L.L.P.

(57) ABSTRACT

A differential amplifier circuit includes a differential operational amplifier that includes a differential pair circuit and operates based on a constant bias current supplied from a bias current source circuit, and the differential amplifier circuit includes a bias current generator circuit. A current monitor circuit detects two currents flowing through the differential pair circuit in correspondence with differential input voltages inputted to the differential pair circuit, and detects a minimum current of the two currents for a difference voltage of the differential input voltages as a monitored current. A current comparator circuit compares the monitored current with the constant bias current. A current amplifier circuit amplifies a voltage corresponding to the comparison result, and controls currents flowing through the differential pair circuit based on an amplified voltage, and the bias current generator circuit performs negative feedback adaptive control such that the bias current increases as the monitored current decreases.

6 Claims, 16 Drawing Sheets

Fig.21

| OPERATIONAL AMPLIFIER CIRCUIT | PREFERRED EMBODIMENT | SECOND PRIOR ART | FIRST PRIOR ART |
|---|---|---|---|
| PROCESS TECHNOLOGY | 0.18μm CMOS PROCESS | | |
| POWER VOLTAGE $V_{dd}$ | 3.0 V | | |
| BIAS CURRENT $I_{BAIAS}, I_{BAIAS2}$ | 50nA | | |
| SLEW RATE $SR^+(f_{in}:1kHz)$ | 0.165 V/μsec | 0.066 V/μsec | 0.035 V/μsec |
| SLEW RATE $SR^-(f_{in}:1kHz)$ | 0.221 V/μsec | 0.061 V/μsec | 0.033 V/μsec |
| CONSUMPTION CURRENT | 321.5 nA | 268.5 nA | 152.3 nA |
| MAXIMUM FREQUENCY $f_{max}$ | 70 kHz | 32 kHz | - |
| OPEN-LOOP GAIN (ADAPTIVE LOOP) | 43.9 dB | - | - |
| PHASE MARGIN (ADAPTIVE LOOP) | 61.3 deg | - | - |
| OPEN-LOOP GAIN (OPERATIONAL AMPLIFIER) | 61.5 dB | 62.0 dB | 61.8 dB |
| PHASE MARGIN (OPERATIONAL AMPLIFIER) | 57.5 deg | 47.9 deg | 58.2 deg |

DIFFERENTIAL AMPLIFIER CIRCUIT WITH ULTRALOW POWER CONSUMPTION PROVIDED WITH ADAPTIVE BIAS CURRENT GENERATOR CIRCUIT

BACKGROUND OF THE INVENTION

1. Field of the Invention

The present invention relates to an ultralow power differential amplifier circuit that uses an adaptive bias current generator circuit.

2. Description of the Related Art

Sub-threshold LSIs utilizing the sub-threshold region operation of MOSFETs attract attention in order to actualize LSIs of ultralow consumption power. However, since this design method is in the initial stage of development, there is a strong demand for the establishment of a design technology of an ultralow power consumption circuit. Up to now, various types of research have been conducted to actualize ultralow power LSIs (See, for example, a Non-Patent Document 1).

A differential amplifier circuit is a basic analog component circuit and is a component circuit of high versatility to achieve various analog operation functions. An operational amplifier, which is a differential amplifier circuit, is used in a negative feedback configuration and operates in a manner that two input terminals are virtually grounded. In general, the characteristics of an operational amplifier are determined by its bias current.

FIG. 1 is a block diagram showing a basic configuration of a prior art operational amplifier circuit of an open loop configuration. In the operational amplifier circuit of FIG. 1, an operational amplifier 1 operates with a bias current from a bias current source circuit 2. Therefore, in order to achieve low power characteristics of an operational amplifier circuit, it is feasible to reduce the bias current and make the circuit perform a minute current operation in, for example, the sub-threshold region. However, the operational amplifier circuit of ultralow power operation has had such a problem that its response time was increased due to the collapse of the virtual grounding caused by an input change ascribed to deterioration in the driving capability due to a minute current bias.

Prior art documents related to the present invention are as follows:

Patent Document 1: Japanese patent laid-open publication No. JP 2010-239554 A; and Patent Document 2: Japanese patent laid-open publication No. JP 2011-182188 A.

Non-Patent Document 1: T. Hirose et al., "A nano-ampere current reference circuit and its temperature dependence control by using temperature characteristics of carrier mobilities", Proceedings of the 36th European Solid-state Circuits Conference, pp. 114-117, September 2010; and Non-Patent Document 2: M. Degrauwe et al., "Adaptive biasing CMOS amplifiers", IEEE Journal of Solid-State Circuits, Vol. 17, pp. 522-528, June 1982.

In order to solve the aforementioned problems, an ultralow power CMOS operational amplifier using the adaptive bias technology is proposed (See, for example, the Non-Patent Document 2). The adaptive bias technology is useful for operational amplifier design using a minute current. However, there is the problem of difficulty in generating a large adaptive bias current in the proposed system, which leads to a failure in making the operational amplifier have high speed.

SUMMARY OF THE INVENTION

An object of the present invention is to solve the aforementioned problems and provide a differential amplifier circuit capable of increasing the operating speed and operating with power consumption lower than that of the prior art.

According to one aspect of the present invention, there is provided a differential amplifier circuit including a differential operational amplifier that includes a differential pair circuit to which differential input voltages are inputted and operates on the basis of a constant bias current supplied from a bias current source circuit, and the differential amplifier circuit includes a bias current generator circuit. The bias current generator circuit includes a current monitor circuit, a current comparator circuit, and a current amplifier circuit. The current monitor circuit detects two currents flowing through the differential pair circuit in correspondence with differential input voltages inputted to the differential pair circuit, and detects a minimum current of the two currents with respect to a difference voltage of the differential input voltages as a monitored current. The current comparator circuit compares the monitored current with the constant bias current supplied from the bias current source circuit, and outputs a voltage corresponding to a comparison result. The current amplifier circuit amplifies a voltage corresponding to the comparison result, and controls currents flowing through the differential pair circuit on the basis of an amplified voltage. The bias current generator circuit performs negative feedback adaptive control such that the bias current flowing through the differential pair circuit increases as the monitored current decreases.

In the above-mentioned differential amplifier circuit, the current comparator circuit includes a p-channel MOS transistor and an n-channel MOS transistor that are connected with each other in series, and a fixed bias voltage is applied to one MOS transistor of the p-channel MOS transistor and the n-channel MOS transistor, and a voltage corresponding to the monitored current is applied to another MOS transistor thereof. The current comparator circuit generates a voltage corresponding to the comparison result by a voltage at a connection point of the p-channel MOS transistor and the n-channel MOS transistor.

In addition, in the above-mentioned differential amplifier circuit, the current monitor circuit includes first and second MOS transistors, which are connected with each other in series. A voltage corresponding to one current of the two currents of the differential pair circuit is applied to the first MOS transistor, and a voltage corresponding to another current of the two currents of the differential pair circuit is applied to the second MOS transistor. The current monitor circuit detects currents flowing through the first and second MOS transistors as monitored currents.

Further, in the above-mentioned differential amplifier circuit, the current monitor circuit further includes third and fourth MOS transistors, which are connected with each other in series and connected in parallel with the circuit of the first and second MOS transistors that are connected with each other in series. A voltage corresponding to another current of the two currents of the differential pair circuit is applied to the third MOS transistor, and a voltage corresponding to one current of the two currents of the differential pair circuit is applied to the fourth MOS transistor. The current monitor circuit detects currents flowing through the first and second MOS transistors and currents flowing through the third and fourth MOS transistors as monitored currents.

Still further, in the above-mentioned differential amplifier circuit, the current monitor circuit includes first, second and third MOS transistors. The first and second MOS transistors are connected with each other in parallel and connected to a first current source of a predetermined bias current, and the third MOS transistor is connected between the first current source and a second current source of a current that is a half of the bias current. A voltage corresponding to one current of the two currents of the differential pair circuit is applied to the first MOS transistor, and a voltage corresponding to another current of the two currents of the differential pair circuit is applied to the second MOS transistor. The current monitor circuit detects a current applied to the third MOS transistor as a monitored current.

Still further, in the above-mentioned differential amplifier circuit, the bias current source circuit operates in a sub-threshold region, and generates a minute bias current.

According to the differential amplifier circuit that uses the bias current generator circuit of the present invention, the bias current generator circuit monitors two input voltages, and controls the adaptive bias current with the negative feedback configuration of the differential pair circuit and the bias current generator circuit. In this case, since the adaptive bias current is generated only when the two input voltages do not coincide with each other, high-speed and low power consumption operation can be achieved.

BRIEF DESCRIPTION OF THE DRAWINGS

These and other objects and features of the present invention will become clear from the following description taken in conjunction with the preferred embodiments thereof with reference to the accompanying drawings throughout which like parts are designated by like reference numerals, and in which:

FIG. 6B(b) is a graph showing a characteristic of a voltage $V_M$ with respect to the monitored current $I_{MNT}$, for explaining an operation of the current comparator circuit 4 of the operational amplifier circuit of FIG. 3;

FIG. 6B(c) is a graph showing a characteristic of an adaptive current $I_{ADP}$ with respect to the monitored current $I_{MNT}$, for explaining an operation of the current comparator circuit 4 of the operational amplifier circuit of FIG. 3;

FIG. 21 is a table showing performance specifications according to the simulation results of the operational amplifier circuits of the preferred embodiment of FIG. 3 and first and second prior arts.

DETAILED DESCRIPTION OF THE PREFERRED EMBODIMENTS

Figure 1:
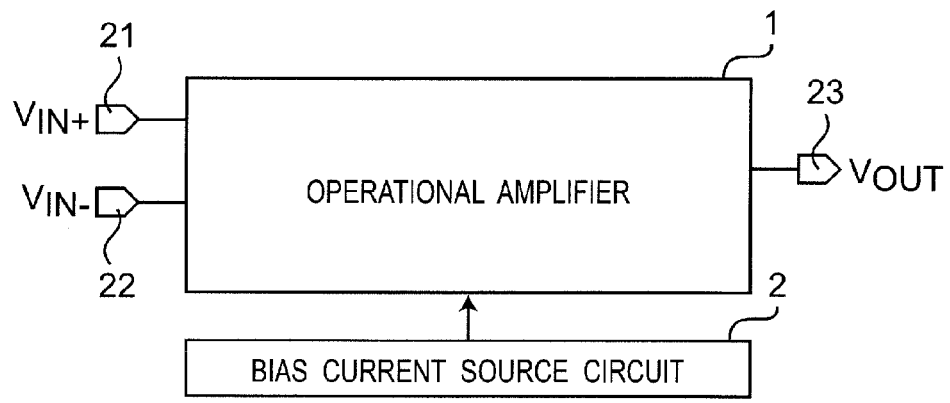
FIG. 1 is a block diagram showing a configuration of a prior art operational amplifier circuit.

Preferred embodiments of the present invention will be described below with reference to the drawings. In the following preferred embodiments, like components are denoted by like reference numerals.

In the preferred embodiments of the present invention, adaptive bias current generator circuits based on a novel architecture are proposed. Moreover, operational amplifiers that use this and achieve high speed and low power consumption are proposed. The operational amplifier circuit of the present preferred embodiment monitors a current flowing through the input differential pair circuit of the operational amplifier, and compares this with a bias current. By generating an adaptive bias current on the basis of a comparison result, the high-speed operation of the operational amplifier is achieved. The configurations of the preferred embodiments and their modified preferred embodiments and the details of simulation evaluation results are described below.

Figure 2:
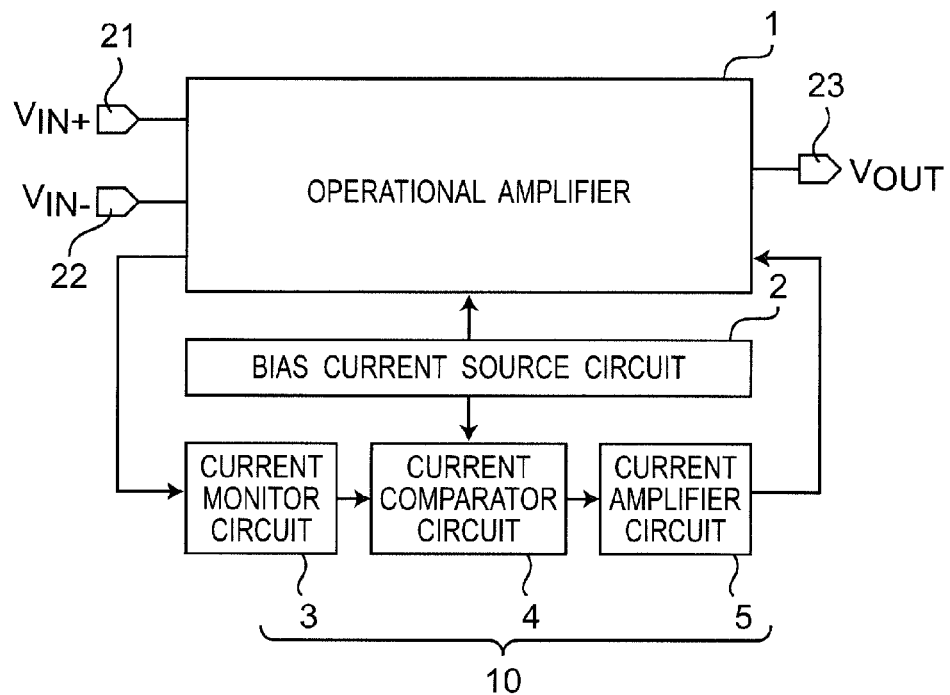
FIG. 2 is a block diagram showing a configuration of an operational amplifier circuit according to one preferred embodiment of the present invention.

FIG. 2 is a block diagram showing a configuration of an operational amplifier circuit according to one preferred embodiment of the present invention. The operational amplifier circuit of FIG. 2 is characterized in that an adaptive bias current generator circuit 10 is further provided as compared with the operational amplifier circuit of FIG. 1 configured to include an operational amplifier 1 of a differential operational amplifier and a bias current source circuit 2. The adaptive bias current generator circuit 10 is configured to include a current monitor circuit 3, a current comparator circuit 4, and a current amplifier circuit 5. The current monitor circuit 3 monitors the current flowing through the differential pair circuit, and detects discordance between input voltages $V_{IN+}$ and $V_{IN-}$ at input terminals 21 and 22. The current comparator circuit 4 compares the monitored current from the current monitor circuit 3 with the bias current from the bias current source circuit 2. According to the results, the current amplifier circuit 5 generates an adaptive bias current and supplies the current to the operational amplifier 1. A large current supplied by the adaptive bias current generator circuit 10 enables the high-speed operation of the operational amplifier 1, and this leads to a high-speed shift to the operating point. Details of the proposed architecture are described below.

Referring to FIG. 2, the current monitor circuit 3 changes its output current depending on the current flowing through the differential pair circuit of the operational amplifier 1. The current monitor circuit 3 outputs a largest current when the two currents flowing through the differential pair circuit are the same (i.e., in the case of an input voltage $V_{IN+}=V_{IN-}$) or outputs a corresponding current that depends on the smaller current when the currents flowing through the differential pair circuit change (i.e., in the case of an input voltage $V_{IN+} \neq V_{IN-}$).

The current comparator circuit 4 compares the magnitude relation between the monitored current and the bias current, and outputs a voltage signal corresponding to the comparison result to control the current amplifier circuit 5. When the monitored current and the bias current are equal to each other, the current comparator circuit 4 stably operates at a certain operating point, and the current amplifier circuit 5 supplies a minute bias current to the differential pair circuit of the operational amplifier 1. In the meantime, the current comparator circuit 4 detects a decrease in the monitored current that becomes smaller than the bias current, and supplies a current so that the current flowing through the differential pair circuit increases by the current amplifier circuit 5. That is, control is performed to supply a current so that the current flowing through the differential pair circuit increases as the monitored current becomes smaller than the bias current. In this case, as a consequence of an increase in the current flowing through the differential pair circuit of the operational amplifier 1, the feedback operation takes such an effect that the monitored current and the bias current become equal to each other. Then, the operation takes effect at the stable point when the input voltages $V_{IN+}$ and $V_{IN-}$ become equal to each other.

Figure 3:
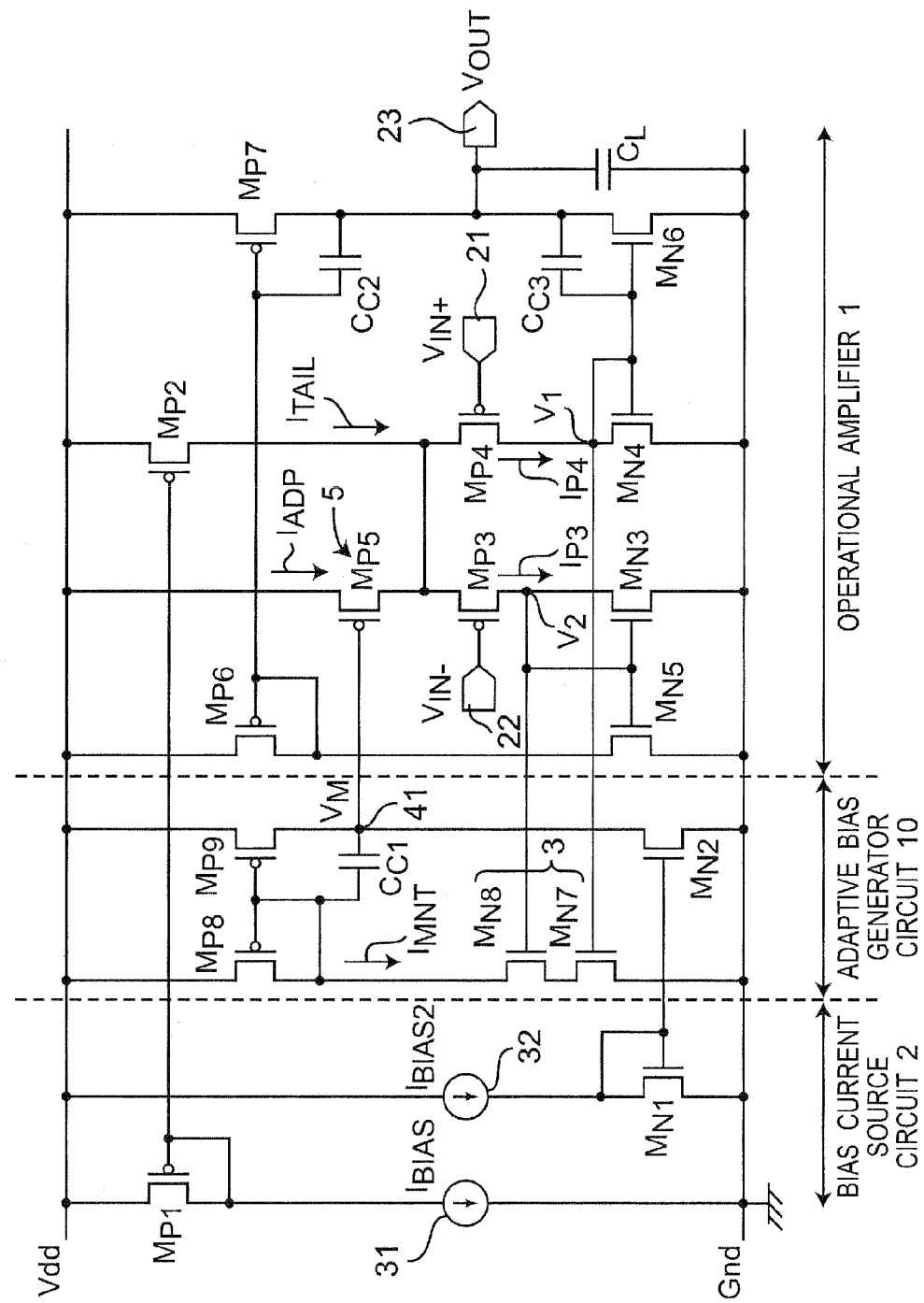
FIG. 3 is a concrete circuit diagram of the operational amplifier circuit of FIG. 2.

FIG. 3 is a concrete circuit diagram of the operational amplifier circuit of FIG. 2. The operational amplifier circuit of FIG. 3 is configured to include a plurality of p-channel MOSFETs (hereinafter referred to as PMOS transistors, denoted by a symbol of a system of $M_{Pi}$ in the specification and the drawings, where "i" is a numeral or the like) and a plurality of n-channel MOSFETs (hereinafter referred to as NMOS transistors, denoted by a symbol of a system of $M_{Ni}$ in the specification and the drawings, where "i" is a numeral or the like), and the operational amplifier circuit of FIG. 3 is configured to include the following:

(a) a nano-ampere bias current source circuit 2, which operates in, for example, the sub-threshold region, and includes a current source 31 of, for example, a nano-ampere-order minute bias current $I_{BIAS}$ and a current source 32 of, for example, a nano-ampere-order minute bias current $I_{BIAS2}$;

(b) a one-stage operational amplifier 1 configured to include input terminals 21 and 22, an output terminal 23, MOS transistors $M_{P2}$ to $M_{P7}$ and $M_{N2}$ to $M_{N6}$; and (c) an adaptive bias current generator circuit 10 configured to include MOS transistors $M_{P5}$, $M_{P8}$, $M_{P9}$, $M_{N7}$, $M_{N8}$ and $M_{N2}$.

In order to achieve ultralow power consumption in the operational amplifier circuit, a nano-ampere current generator circuit 2 that operates in, for example, the sub-threshold region is used (See, for example, the Non-Patent Document 1). It is noted that the PMOS transistors and the NMOS transistors are referred to as MOS transistors.

Referring to FIG. 3, the current monitor circuit 3 is configured to include a series connection of MOS transistors $M_{N7}$ and $M_{N8}$, and monitors the currents flowing through both the paths of the differential pair circuit configured to include MOS transistors $M_{P3}$ and $M_{P4}$. When the input voltages $V_{IN+}$ and $V_{IN-}$ inputted to the respective input terminals 21 and 22 are equal to each other and the two currents flowing through both the paths of the differential pair circuit are equal to each other, a current smaller than each of currents $I_{P3}$ and $I_{P4}$ flowing through the MOS transistors $M_{N3}$ and $M_{N4}$ is outputted. When the input voltages $V_{IN+}$ and $V_{IN-}$ change to generate a difference between the currents $I_{P3}$ and $I_{P4}$ flowing through the differential pair circuit, a corresponding current depending on the smaller current of the currents flowing through the MOS transistors $M_{N3}$ and $M_{N4}$ is outputted.

The current comparator circuit 4 is configured to include MOS transistors $M_{P9}$ and $M_{N2}$, while the current amplifier circuit 5 is configured to include an MOS transistor $M_{P9}$. A current flowing through the MOS transistor $M_{P9}$ and a current flowing through the MOS transistor $M_{N2}$ are compared with each other at a connection point 41, and a voltage $V_M$ of the comparison result is outputted to the gate of the MOS transistor $M_{P9}$. When the monitored current flowing through the MOS transistor $M_{P9}$ is larger than the bias current flowing through the MOS transistor $M_{N2}$, control is performed so that the voltage $V_M$ of the comparison result rises and the current of MOS transistor $M_{P9}$ decreases. When the current flowing through the MOS transistor $M_{P9}$ is smaller than the current flowing through the MOS transistor $M_{N2}$, control is performed so that the voltage $V_M$ of the comparison result decreases and the current of the MOS transistor $M_{P9}$ increases.

The operations of the component circuits 3, 4 and 5 are described in detail below.

Figure 4:
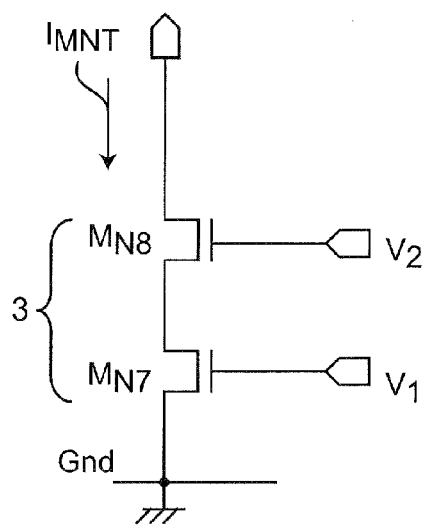
FIG. 4 is a circuit diagram for explaining a basic circuit of the current monitor circuit 3 of the operational amplifier circuit of FIG. 3.

FIG. 4 is a circuit diagram for explaining a basic circuit of the current monitor circuit 3 of the operational amplifier circuit of FIG. 3. The current monitor circuit 3 of FIG. 4 is configured to include two series-connected MOS transistors $M_{N7}$ and $M_{N8}$. A voltage $V_1$ induced by the current $I_{P4}$ flowing through the MOS transistor $M_{P4}$ of the differential pair circuit is applied to the gate of the MOS transistor $M_{N7}$, and a voltage $V_2$ induced by the current $I_{P3}$ flowing through the MOS transistor $M_{P3}$ of the differential pair circuit is applied to the gate of the MOS transistor $M_{N8}$. Therefore, the current monitor circuit 3 monitors the currents $I_{P3}$ and $I_{P4}$ flowing through the differential pair circuit, and outputs the monitored current $I_{MNT}$ corresponding to them as described below.

Figure 5A:
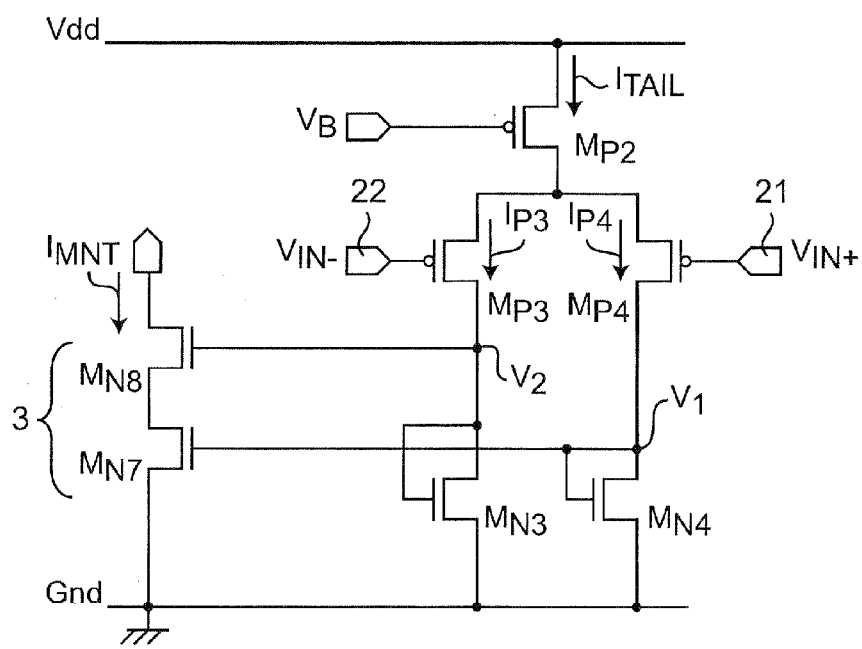
FIG. 5A is a circuit diagram of the differential pair circuit of the operational amplifier circuit and the current monitor circuit 3 of FIG. 3.
Figure 5B:
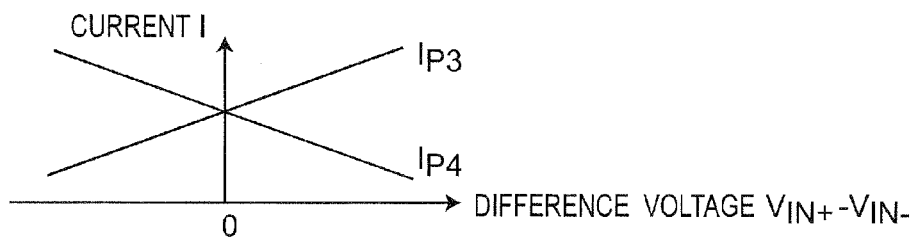
FIG. 5B is a graph showing characteristics of currents $I_{P3}$ and $I_{P4}$ with respect to an input difference voltage ($V_{IN+}-V_{IN-}$) to the differential pair, for explaining an operation of the current monitor circuit 3 of the operational amplifier circuit of FIG. 3.
Figure 5C:
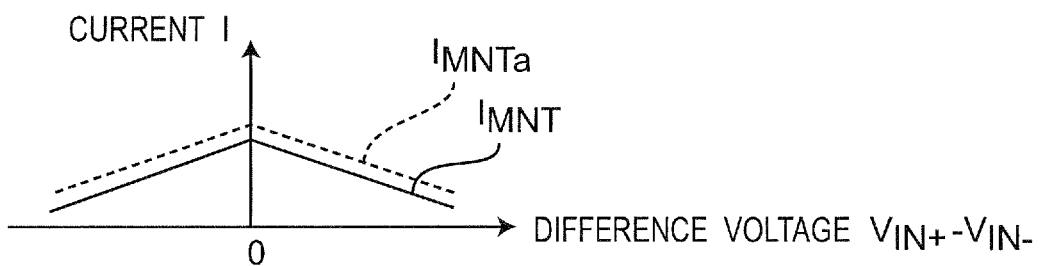
FIG. 5C is a graph showing characteristics of monitored currents $I_{MNT}$ and $I_{MNTa}$ with respect to the input difference voltage ($V_{IN+}-V_{IN-}$) to the differential pair, for explaining an operation of the current monitor circuit 3 of the operational amplifier circuit of FIG. 3.

FIG. 5A is a circuit diagram of the differential pair circuit and the current monitor circuit 3 of the operational amplifier circuit of FIG. 3. Further, FIG. 5B is a graph showing characteristics of the currents $I_{P3}$ and $I_{P4}$ with respect to the input difference voltage ($V_{IN+}-V_{IN-}$) to the differential pair, for explaining an operation of the current monitor circuit 3 of the operational amplifier circuit of FIG. 3. In this case, FIGS. 5B and 5C are image charts of current waveforms for explaining a circuit operation. The current waveform responses to the difference voltage ($V_{IN+}-V_{IN-}$) of the two input voltages are shown. It is noted that the current waveforms are simply illustrated for the sake of simplicity.

Next, details of the circuit operation of the current monitor circuit 3 are described with reference to FIGS. 5A to 5C.

In the differential pair circuit, the flowing currents change depending on the input voltages $V_{IN+}$ and $V_{IN-}$. FIG. 5B shows the behaviors thereof. The current $I_{P3}$ increases when the input voltage $V_{IN+}$ becomes larger than the input voltage $V_{IN-}$, and the current $I_{P4}$ increases when the input voltage $V_{IN+}$ becomes smaller than the input voltage $V_{IN-}$. The MOS transistors $M_{N3}$ and $M_{N4}$ of the diode connection configuration receive the currents, and generate gate-source voltages corresponding to the respective currents. The voltages are monitored by the current monitor circuit 3 configured to include the series-connected MOS transistors $M_{N7}$ and $M_{N8}$.

Regarding the currents flowing through the current monitor circuit 3, the corresponding monitored current $I_{MNT}$ depending on the smaller current of the currents $I_{P3}$ and $I_{P4}$ outputted from the differential pair circuit is outputted. Since the MOS transistor $M_{N7}$ and $M_{N8}$ are connected in series, the monitored current $I_{MNT}$ flowing through the current monitor circuit 3 is determined by the MOS transistor $M_{N7}$ when the gate voltage of the MOS transistor $M_{N7}$ is smaller than the gate voltage of the MOS transistor $M_{N8}$. However, when the gate voltage of the MOS transistor $M_{N8}$ is smaller than the gate voltage of the MOS transistor $M_{N7}$, the current is determined by the MOS transistor $M_{N8}$. Details are as follows.

A case in which the current $I_{P4}$ of the differential pair circuit is smaller than the current $I_{P3}$ is considered. In this case, regarding the gate voltages of the MOS transistor $M_{N7}$ and $M_{N8}$, the gate voltage of the MOS transistor $M_{N7}$, through which the current $I_{P4}$ smaller than the current $I_{P3}$ flows, becomes lower. Since the MOS transistors $M_{N4}$ and $M_{N7}$ constitute a current mirror circuit, the MOS transistor $M_{N7}$ tries to flow the smaller current $I_{P4}$. In the meantime, due to the connection configuration of the MOS transistors $M_{N3}$ and $M_{N8}$, the MOS transistor $M_{N8}$ is biased with a gate voltage such that the larger current $I_{P3}$ flows. However, since the flowing current is determined by the MOS transistor $M_{N7}$, a current larger than the current $I_{P4}$ cannot be flowed. Therefore, the corresponding monitored current $I_{MNT}$ depending on the current $I_{P4}$ is outputted.

Moreover, a case in which the current $I_{P3}$ of the differential pair circuit is smaller than the current $I_{P4}$ is considered. In this case, regarding the gate voltages of the MOS transistor $M_{N7}$ and $M_{N8}$, the gate voltage of the MOS transistors $M_{N8}$, through which the current $I_{P3}$ smaller than the current $I_{P4}$ flows, becomes lower. Since the MOS transistors $M_{N4}$ and $M_{N7}$ constitute a current mirror circuit, the MOS transistor $M_{N7}$ tries to flow the larger current $I_{P4}$. However, due to the connection configuration of the MOS transistor $M_3$ and $M_{N8}$, the MOS transistor $M_{N8}$ is biased with a gate voltage such that the smaller current $I_{P3}$ flows. This means that the drain-source voltage of the MOS transistor $M_{N7}$ decreases, and the MOS transistor $M_{N7}$ is to operate in the linear region. Therefore, the MOS transistors $M_{N4}$ and $M_{N7}$ cannot operate as a current mirror circuit. Since the MOS transistor $M_{N8}$ is biased with a gate voltage such that the current $I_{P3}$ is flowed by the MOS transistor $M_{N3}$, the corresponding monitored current $I_{MNT}$ depending on the current $I_{P3}$ is outputted.

Further, a case in which the currents $I_{P3}$ and $I_{P4}$ are equal to each other is considered. In this case, the MOS transistors $M_{N7}$ and $M_{N8}$ are both biased with mutually identical gate voltages, the MOS transistors $M_{N7}$ operates in the linear region. Since the MOS transistor $M_{N8}$ operates in the saturation region, the corresponding monitored current $I_{MNT}$ depending on the currents $I_{P3}$ and $I_{P4}$ is outputted.

Referring to FIG. 5C, the smaller current (minimum current) of the currents $I_{P3}$ and $I_{P4}$ becomes the current $I_{MNTa}$, and actually the monitored current $I_{MNT}$ which is slightly smaller than the current $I_{MNTa}$ flows because of the relation of the gate-source voltage when the two MOS transistors $M_{N7}$ and $M_{N8}$ are connected in series, as shown in FIG. 5C.

Figure 6A:
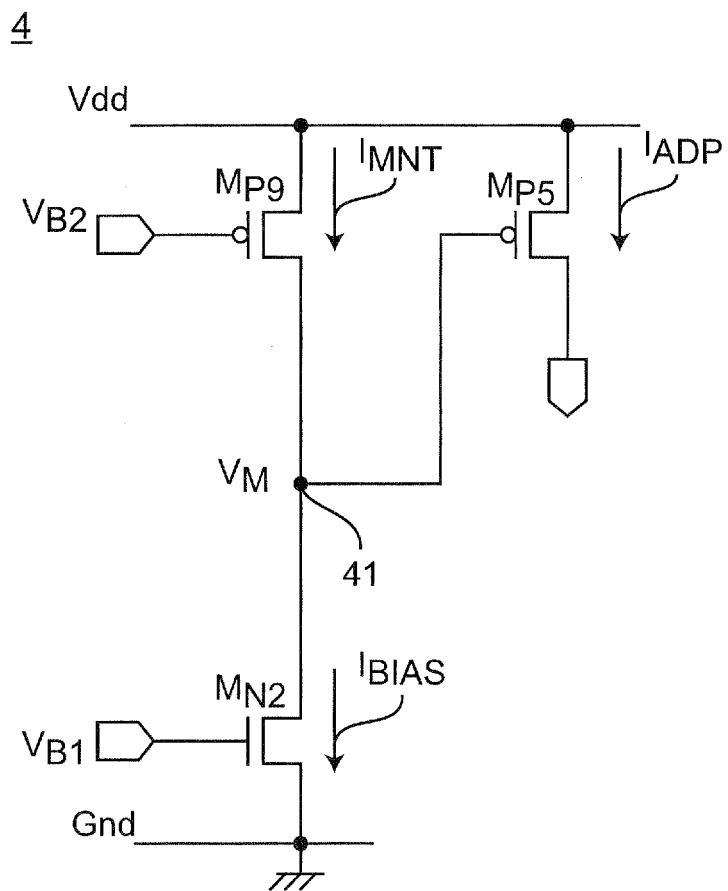
FIG. 6A is a circuit diagram for explaining an operation of the current comparator circuit 4 of the operational amplifier circuit of FIG. 3.
Figure 6B:
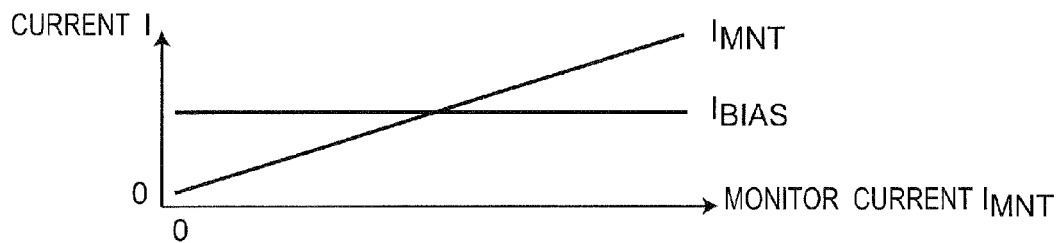
FIG. 6B(a) is a graph showing characteristics of monitored currents $I_{MNT}$ and $I_{BIAS}$ with respect to the monitored current $I_{MNT}$, for explaining an operation of the current comparator circuit 4 of the operational amplifier circuit of FIG. 3.
Figure 6B:
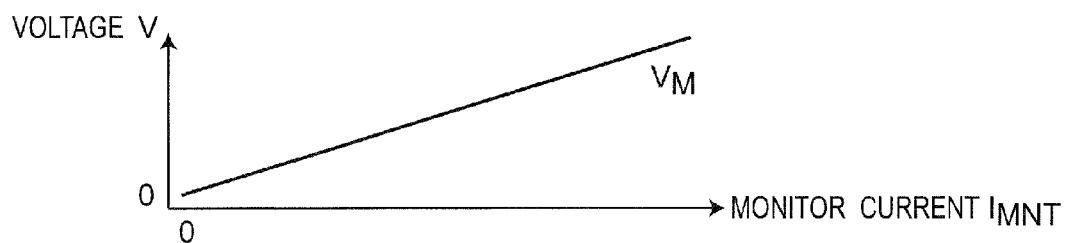
Figure 6B:
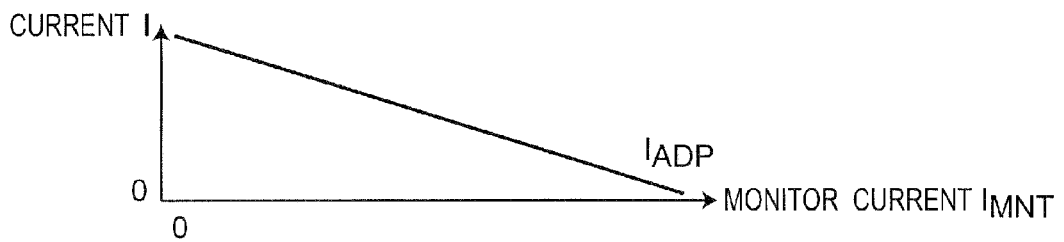

FIG. 6A is a circuit diagram for explaining an operation of the current comparator circuit 4 of the operational amplifier circuit of FIG. 3. Moreover, FIG. 6B(a) is a graph showing characteristics of the currents $I_{MNT}$ and $I_{BIAS}$ with respect to the monitored current $I_{MNT}$, for explaining an operation of the current comparator circuit 4 of the operational amplifier circuit of FIG. 3. FIG. 6B(b) is a graph showing a characteristic of the voltage $V_M$ with respect to the monitored current $I_{MNT}$, for explaining an operation of the current comparator circuit 4 of the operational amplifier circuit of FIG. 3. FIG. 6B(c) is a graph showing a characteristic of the adaptive current $I_{ADP}$ with respect to the monitored current $I_{MNT}$, for explaining an operation of the current comparator circuit 4 of the operational amplifier circuit of FIG. 3.

Referring to FIG. 6A, the MOS transistors $M_{N2}$ and $M_{P9}$ constitute the current comparator circuit 4, and the MOS transistor $M_{P5}$ constitutes the current amplifier circuit 5. The MOS transistor $M_{N2}$ flows the bias current $I_{BIAS}$, and the MOS transistor $M_{P9}$ flows the monitored current $I_{MNT}$. The relation between the bias current $I_{BIAS}$ and the monitored current $I_{MNT}$ are shown in FIG. 6B(a). The bias current $I_{BIAS}$ is a constant current, and indicates a change in the monitored current $I_{MNT}$. With the change in the monitored current $I_{MNT}$, the voltage $V_M$ at the connection point 41 changes as shown in FIG. 6B(b). This voltage is applied to the gate of the MOS transistor $M_{P5}$ of the current amplifier circuit 5. Therefore, as shown in FIG. 6B(c), control is performed so that the MOS transistor $M_{P5}$ flows the larger current when the voltage $V_M$ at the connection point 41 is lowered, and the MOS transistor $M_{P5}$ flows the smaller current when the voltage $V_M$ at the connection point 41 rises.

Next, the operation of the operational amplifier circuit that uses the adaptive bias current generator circuit 10 is described below.

In the operational amplifier circuit that uses the adaptive bias current generator circuit 10, the monitored current $I_{MNT}$ changes depending on the changes in the input voltages $V_{IN+}$ and $V_{IN-}$ as described with reference to FIGS. 5A to 6B, and the changes are detected by current comparison to control the adaptive bias current $I_{ADP}$. As shown in FIG. 6B, the adaptive bias current $I_{ADP}$ changes in reverse phase to the change in the monitored current $I_{MNT}$. That is, the stabilization is achieved with the bias current $I_{BIAS}$ in the regular operation, whereas the feedback operation is performed when the monitored current $I_{MNT}$ changes so as to set this back to the bias current $I_{BIAS}$.

The circuit operation of the operational amplifier 1 that uses the adaptive bias current generator circuit 10 configured as above is described below.

(1) In the case of the input voltage $V_{IN+}=V_{IN-}$, the equal currents flow through both the paths of the differential pair, and a current taken out by the adaptive bias current generator circuit 10 becomes maximized. With the feedback configuration, the operation is performed so that the bias current $I_{BIAS}$ and the monitored current $I_{MNT}$ become equal to each other.

(2) In the case of the input voltage $V_{IN+} \neq V_{IN-}$, almost the whole tail current $I_{TAIL}$ flows through one path of the differential pair and a minute current flows through the other path when the input voltages $V_{IN+}$ and $V_{IN-}$ change. A minute current flows as the monitored current $I_{MNT}$ since the adaptive bias current generator circuit 10 outputs the corresponding current depending on the minimum current. In the meantime, since the MOS transistor $M_{N2}$ flows the bias current $I_{BIAS}$, the electrical potential $V_M$ at the connection point 41 is lowered, i.e., the adaptive bias current $I_{ADP}$ becomes a large current as a consequence of a fall in the gate voltage of the MOS transistor $M_{P9}$.

As described above, with the feedback control by monitoring the monitored current $I_{MNT}$, the adaptive bias current $I_{ADP}$ increases only when a difference is generated between the input voltages $V_{IN+}$ and $V_{IN-}$, and this leads to the high-speed operation. Moreover, a low power consumption characteristic is achieved because of minute current operation in the standby stage in which the input voltages $V_{IN+}$ and $V_{IN-}$ do not change.

Figure 6C:
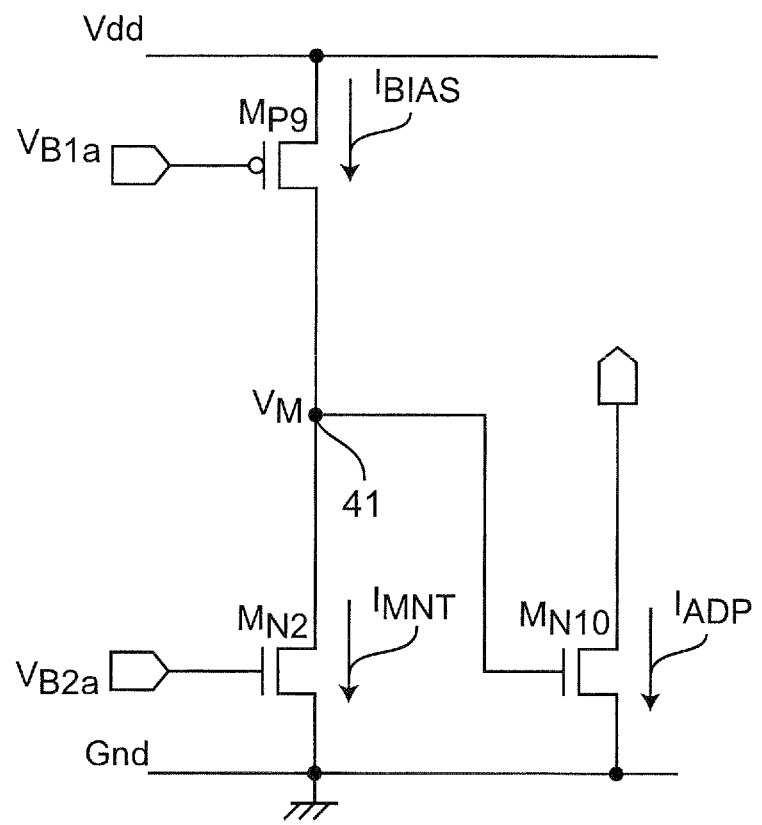
FIG. 6C is a circuit diagram showing a configuration of a current comparator circuit 4a according to a modified preferred embodiment of the current comparator circuit 4 of FIG. 6A.

FIG. 6C is a circuit diagram showing a configuration of a current comparator circuit 4a according to a modified preferred embodiment of the current comparator circuit 4 of FIG. 6A. In the current comparator circuit 4 of FIG. 6A, mutually series-connected MOS transistors $M_{P9}$ and $M_{N2}$ are provided, a voltage $V_{B2}$ corresponding to the monitored current $I_{MNT}$ is applied to the gate of the MOS transistor $M_{P9}$, and a fixed bias $V_{B1}$ is applied to the MOS transistor $M_{N2}$. However, the present invention is not limited to this but allowed to be configured in a manner similar to that of the modified preferred embodiment of FIG. 6C. That is, there may be a configuration in which a fixed bias voltage $V_{B1a}$ is applied to the gate of the MOS transistor $M_{P9}$, a voltage $V_{B2a}$ corresponding to the monitored current $I_{MNT}$ is applied to the MOS transistor $M_{N2}$, and the adaptive bias current $I_{ADP}$ flowing through the MOS transistor $M_{N10}$ is controlled by the voltage $V_M$ at the connection point 41.

Figure 7:
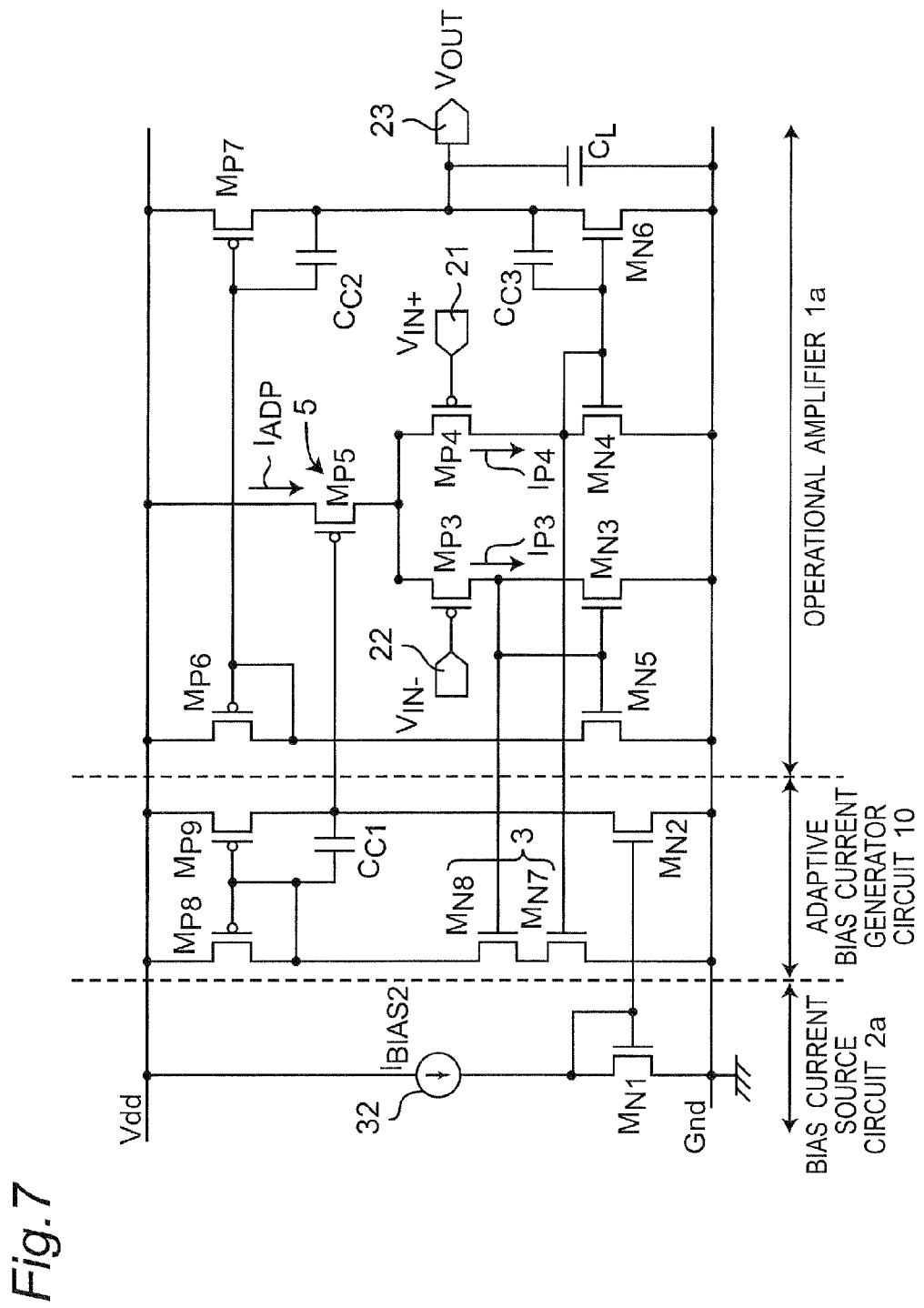
FIG. 7 is a circuit diagram showing a configuration of an operational amplifier circuit according to a first modified preferred embodiment of the present invention.

FIG. 7 is a circuit diagram showing a configuration of an operational amplifier circuit according to the first modified preferred embodiment of the present invention. As compared with the preferred embodiment of FIG. 3, the first modified preferred embodiment of FIG. 7 is characterized in that:

(a) the bias current source circuit 2a is configured to include only a current source 32 and a MOS transistor $M_{N1}$ as compared with the bias current source circuit 2, and (b) the MOS transistor $M_{P2}$ is eliminated in the operational amplifier 1a as compared with the operational amplifier 1.

That is, in the operational amplifier circuit of the preferred embodiment shown in FIG. 3, the bias current $I_{BIAS}$ and the adaptive bias current $I_{ADP}$ supplied to the operational amplifier 1 have been supplied by different MOS transistors $M_{P2}$ and $M_{P9}$. The circuit can be simplified with only the common MOS transistor $M_{P5}$.

Figure 8:
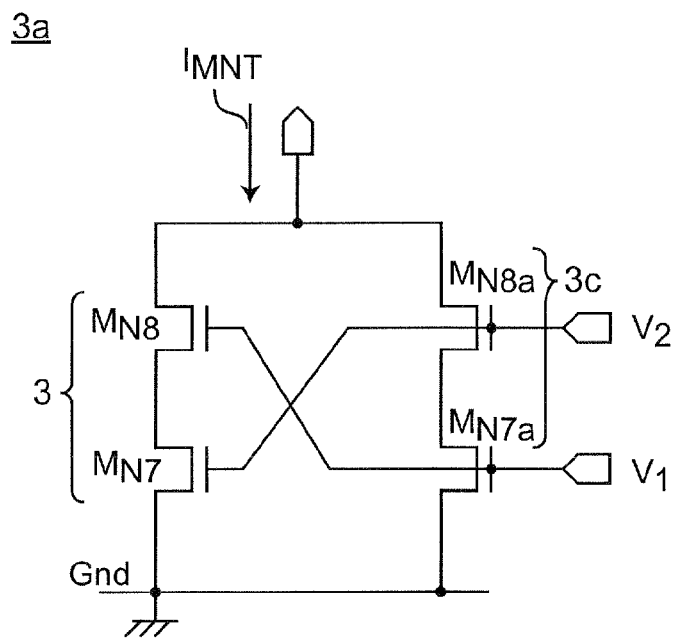
FIG. 8 is a circuit diagram showing a current monitor circuit 3a of an operational amplifier circuit according to a second modified preferred embodiment of the present invention.

FIG. 8 is a circuit diagram showing a current monitor circuit 3a of an operational amplifier circuit according to the second modified preferred embodiment of the present invention. The second modified preferred embodiment of FIG. 8 is characterized in that a current monitor circuit 3c constituted by serially connecting MOS transistors $M_{N7a}$ and $M_{N8a}$ is further connected in parallel with the current monitor circuit 3 as compared with the preferred embodiment of FIG. 3.

In the current monitor circuit 3 shown in FIG. 4, the MOS transistor $M_{N7}$ placed on the ground side consistently monitors the voltage $V_1$ of the differential pair circuit, and the MOS transistor $M_{N8}$ placed on the upper side of the series connection consistently monitors the voltage $V_2$ of the differential pair circuit. That is, the current monitor circuit 3 of FIG. 4 has an asymmetry. In order to ease this, the current monitor circuit 3a of FIG. 8 having symmetry is configured. As apparent from the circuit structure of FIG. 8, the voltage $V_1$ of the differential pair circuit is applied to the gate of the MOS transistor $M_{N8}$ and the gate of the MOS transistor $M_{N7a}$, and the voltage $V_2$ of the differential pair circuit is applied to the gate of the MOS transistor $M_{N7}$ and the gate of the MOS transistor $M_{N8a}$. Therefore, by averaging the gate-source voltages of the MOS transistors that constitute the current monitor circuit 3a with the current monitor circuit 3a having symmetry, the asymmetry in the current monitor circuit 3 of FIG. 4 can be eased, and the monitored current $I_{MNT}$ can be accurately monitored.

Figure 9:
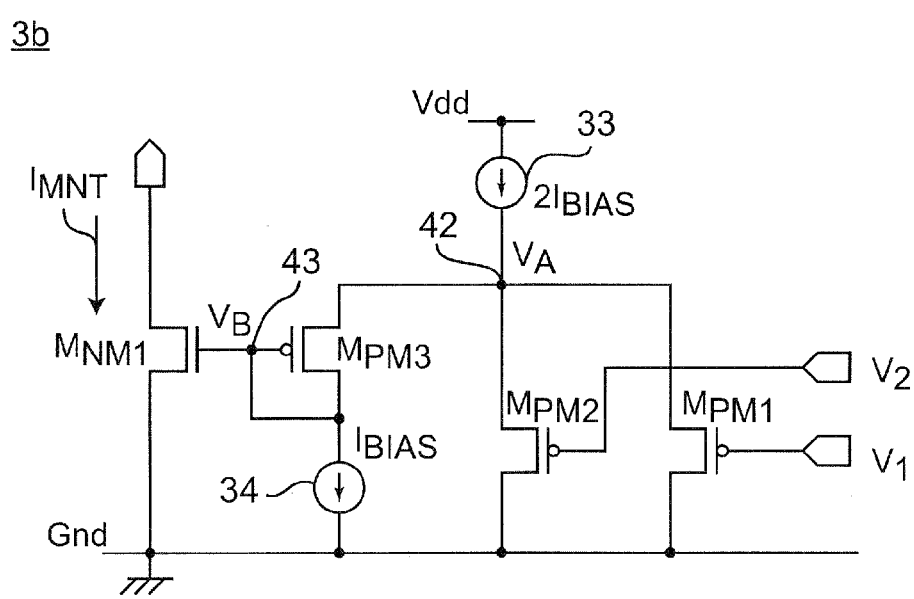
FIG. 9 is a circuit diagram showing a current monitor circuit 3b of an operational amplifier circuit according to a third modified preferred embodiment of the present invention.
Figure 10A:
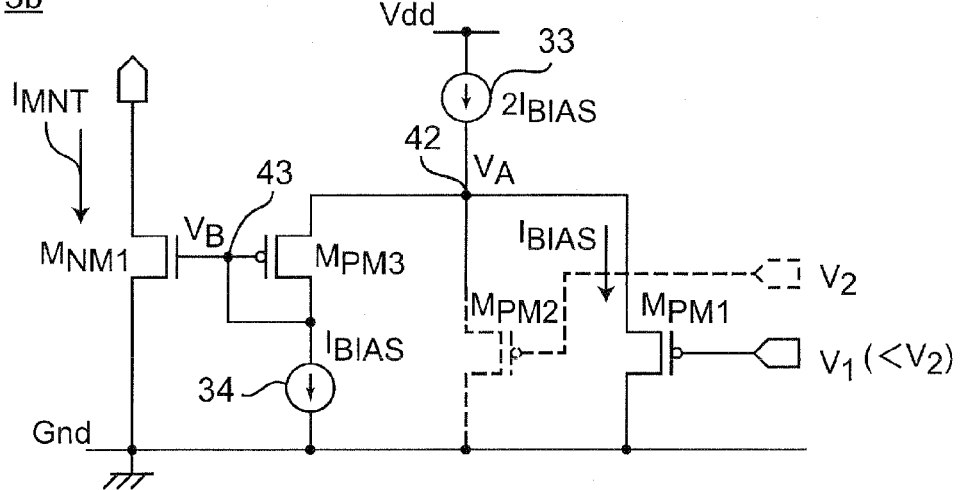
FIG. 10A is a circuit diagram showing a first operation of the current monitor circuit 3b of FIG. 9.
Figure 10B:
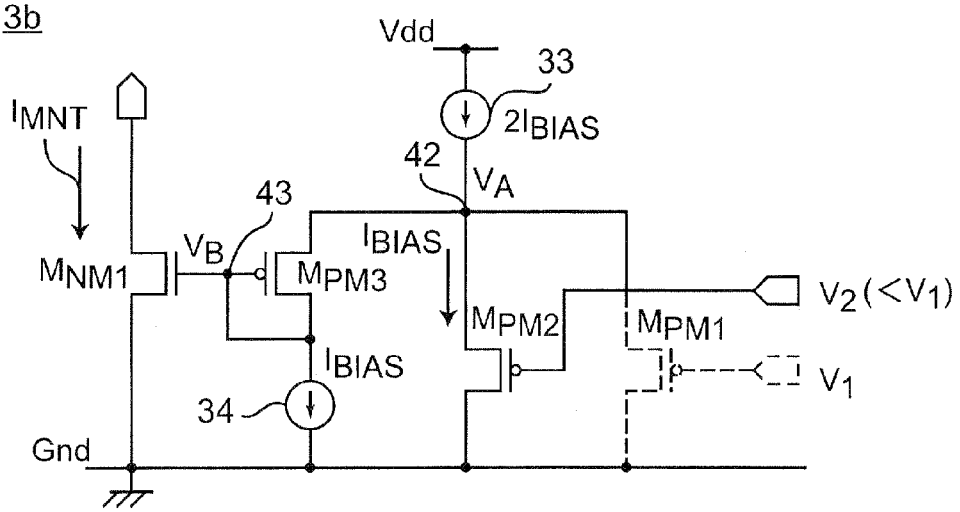
FIG. 10B is a circuit diagram showing a second operation of the current monitor circuit 3b of FIG. 9.

FIG. 9 is a circuit diagram showing a current monitor circuit 3b of an operational amplifier circuit according to the third modified preferred embodiment of the present invention. FIG. 10A is a circuit diagram showing a first operation of the current monitor circuit 3b of FIG. 9, and FIG. 10B is a circuit diagram showing a second operation of the current monitor circuit 3b of FIG. 9.

The current monitor circuit 3 of FIG. 4 has detected the minimum monitored current $I_{MNT}$ (FIG. 5C) by the two MOS transistors $M_{N7}$ and $M_{N8}$ connected in series. As another method, the desired monitored current $I_{MNT}$ can be monitored also with the configuration of the current monitor circuit 3b shown in FIG. 9. Referring to FIG. 9, the voltages $V_1$ and $V_2$ of the differential pair circuit are applied to the gates of the respective MOS transistors $M_{PM1}$ and $M_{PM2}$, which are supplied with the bias current by the current source 33 of a bias current $2I_{BIAS}$ and connected in parallel, while the current monitor circuit 3b generates the monitored current $I_{MNT}$ by a MOS transistor $M_{NM1}$ that constitutes a pair with the MOS transistor $M_{PM3}$ connected to the current source 34 of the bias current $I_{BIAS}$.

The operation of the current monitor circuit 3b of FIG. 9 configured as above is described below with reference to FIGS. 10A and 10B.

Regarding the voltages $V_1$ and $V_2$ of the differential pair circuit, a case in which the voltage $V_1$ is smaller than the voltage $V_2$ is considered. In this case, as shown in FIG. 10A, the MOS transistor $M_{PM2}$ related to the voltage $V_2$ is turned off, and the circuit, which is substantially not related, is therefore illustrated by dashed lines in the figure. The two PMOS transistors $M_{PM1}$ and $M_{PM2}$ each constitute a source follower, and the electrical potential VA at the connection point 42 on the other end side of the current source 33 is common. Therefore, when the voltage $V_1$ is smaller than the voltage $V_2$, the gate-source voltage of the MOS transistor $M_{PM1}$, to which the voltage $V_1$ is inputted, becomes greater than the gate-source voltage of the MOS transistor $M_{PM2}$. That is, the current $I_{BIAS}$ obtained by excluding the current $I_{BIAS}$ flowing through the MOS transistor $M_{PM3}$ from the bias current $2I_{BIAS}$ flows through the MOS transistor $M_{PM1}$. As a result, the voltage VA at the connection point 42 becomes a voltage obtained by adding the gate-source voltage of the MOS transistor $M_{PM1}$ to the voltage $V_1$. By subtracting the gate-source voltage from this by the MOS transistor $M_{PM3}$ through which the bias current $I_{BIAS}$ flows, the voltage VB at a connection point 43 of the gates of the MOS transistors $M_{PM3}$ and $M_{NM1}$ becomes the voltage $V_1$. That is, the gate-source voltage added by the MOS transistor $M_{PM1}$ is equal to the gate-source voltage subtracted by the MOS transistor $M_{PM3}$. This is because the flowing currents are the same as each other and are equal to a current of $I_{BIAS}$. The monitored current $I_{MNT}$ is outputted by the MOS transistor $M_{NM1}$ to which the voltage VB is inputted, and the smaller current of the two currents flowing through the differential pair circuit can be outputted.

Moreover, regarding the voltages $V_1$ and $V_2$ of the differential pair circuit, a case in which the voltage $V_2$ is smaller than the voltage $V_1$ is considered. In this case, as shown in FIG. 10B, the MOS transistor $M_{PM1}$ related to the voltage $V_1$ is turned off, and the circuit, which is not substantially related, is therefore illustrated by dashed lines in the figure. In addition, in this case, the operation similar to the above is performed.

Figure 11:
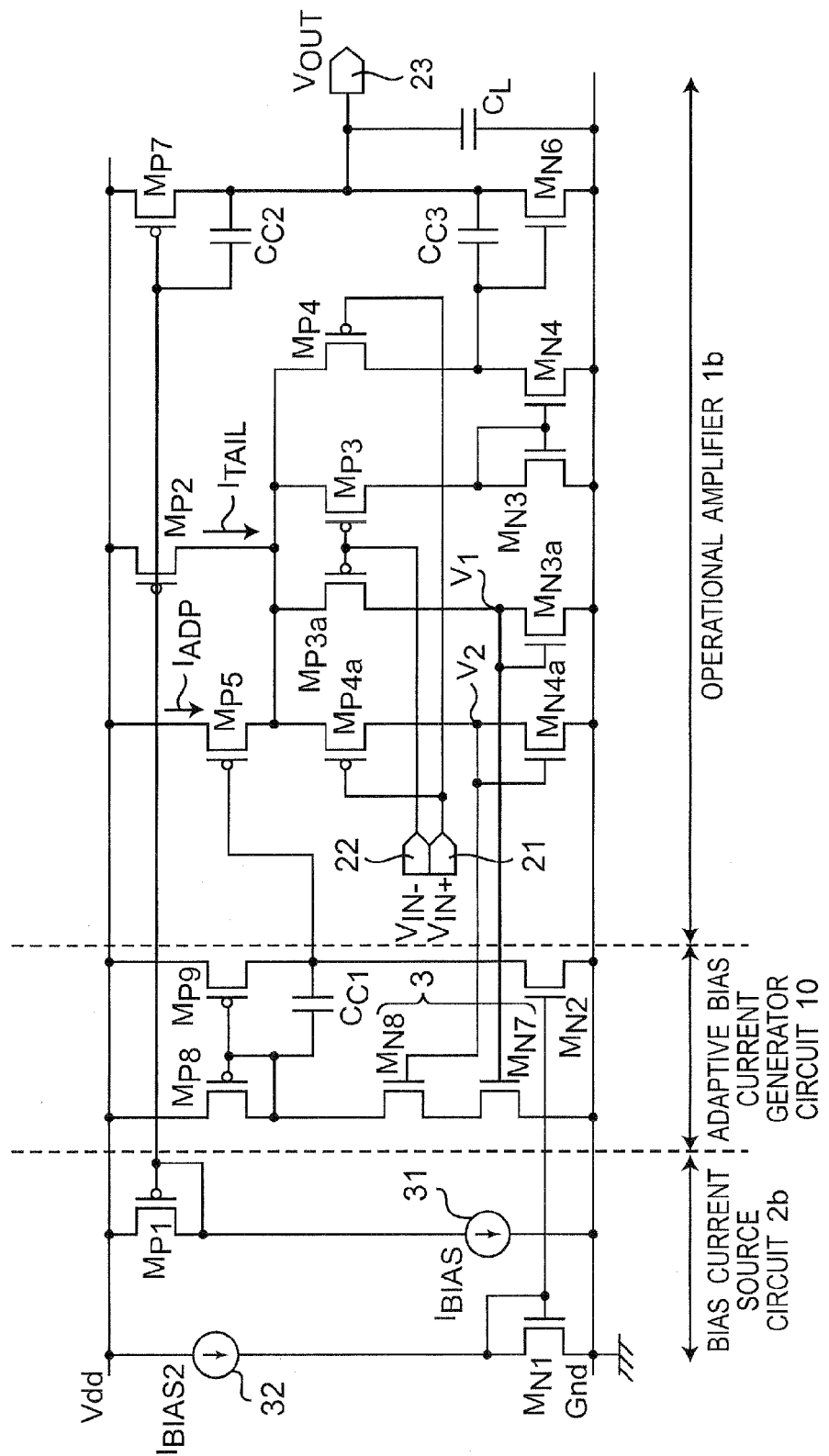
FIG. 11 is a circuit diagram showing a configuration of an operational amplifier circuit according to a fourth modified preferred embodiment of the present invention.

FIG. 11 is a circuit diagram showing a configuration of an operational amplifier circuit according to the fourth modified preferred embodiment of the present invention. That is, the operational amplifier circuit of FIG. 11 shows an example in which an adaptive bias current generator circuit 2b is applied to a two-stage operational amplifier 1b. The two-stage operational amplifier 1b is configured to include a basic differential pair circuit and a common-source amplifier (or source-grounded amplifier). The operational amplifier is generally utilized since the gain can be set larger than that of the one-stage operational amplifier. The operational amplifier 1b of FIG. 11 is characterized in that a order to monitor the current flowing through the differential pair circuit as compared with the operational amplifier 1 of FIG. 3. This makes it possible to monitor the current flowing through the differential pair circuit of the two-stage operational amplifier 1b and amplify the monitored current $I_{MNT}$ depending on the input voltages $V_{IN+}$ and $V_{IN-}$.

In the operational amplifier circuit of FIG. 11, speedup of the differential pair circuit in the first stage can be achieved by using the adaptive bias technology. However, speedup of the output stage has not been achieved. In general, the current flowing through the output stage of the common-source amplifier (or source-grounded amplifier) is large with respect to the current flowing through the differential pair circuit, it is often such a case that speedup can be achieved by amplifying the current flowing through the differential pair circuit. However, in order to achieve further speedup, speedup of the output stage is also required. A circuit for achieving this is shown below.

Figure 12:
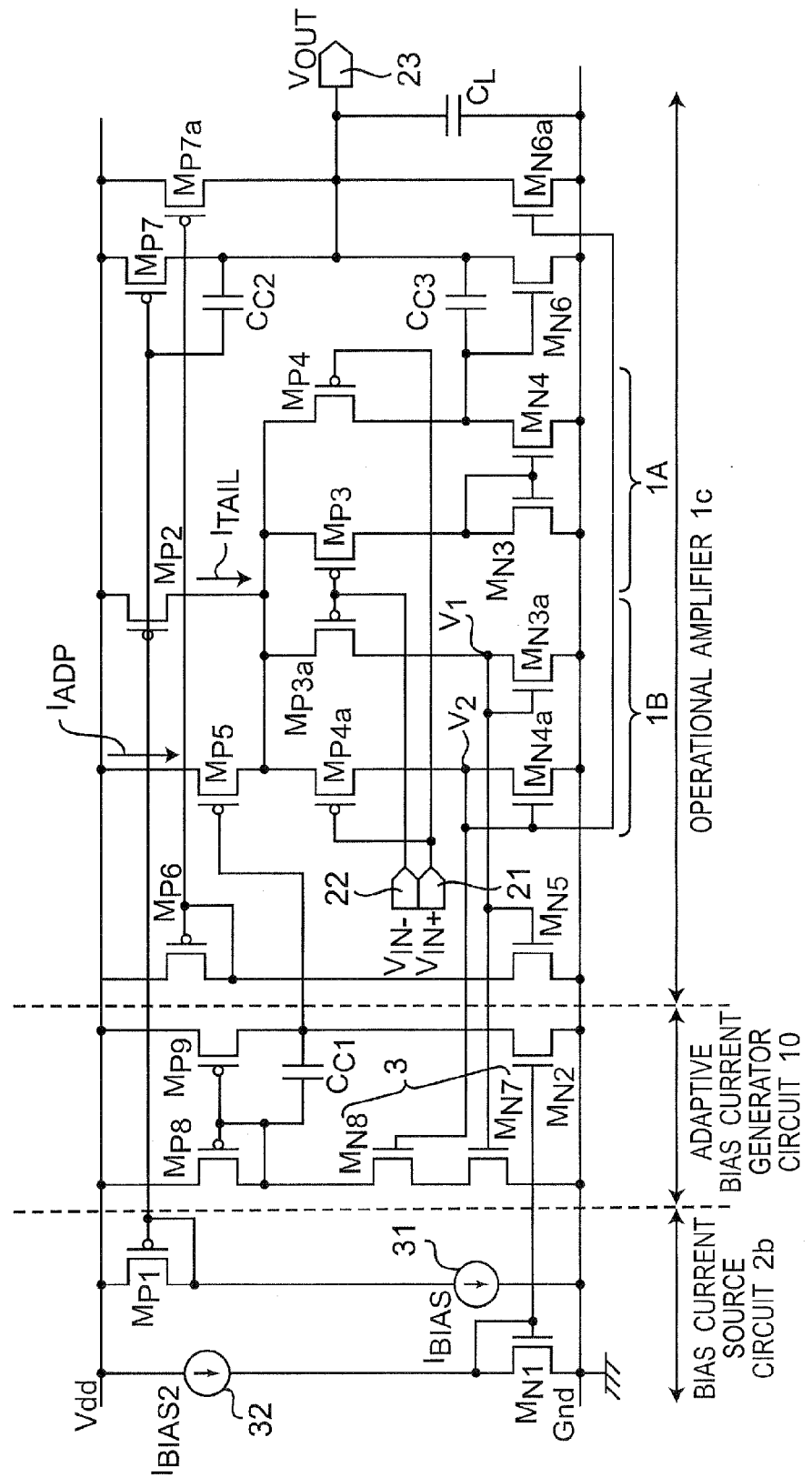
FIG. 12 is a circuit diagram showing a configuration of an operational amplifier circuit according to a fifth modified preferred embodiment of the present invention.
Figure 13:
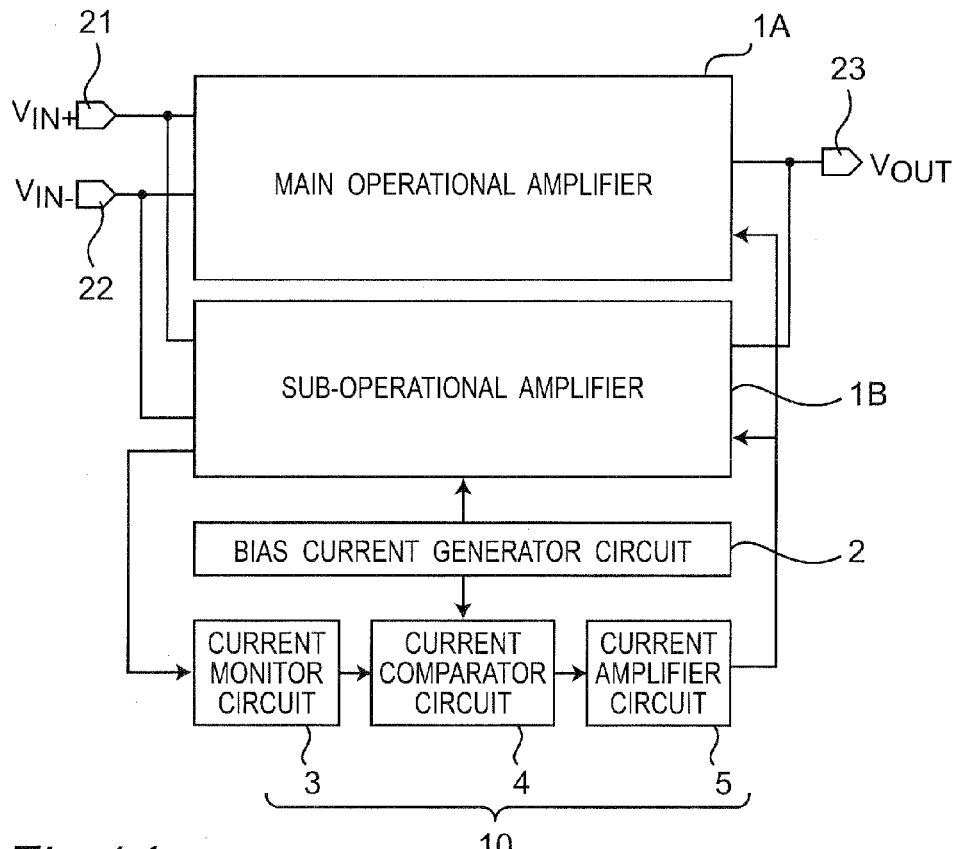
FIG. 13 is a block diagram showing a basic configuration of the differential amplifier circuit of FIG. 12.

FIG. 12 is a circuit diagram showing a configuration of an operational amplifier circuit according to the fifth modified preferred embodiment of the present invention. FIG. 13 is a block diagram showing a basic configuration of the operational amplifier circuit of FIG. 12. That is, FIG. 12 shows a configuration of an improved operational amplifier circuit of FIG. 11. This operational amplifier circuit is configured to include the architecture shown in FIG. 13. That is, the operational amplifier is separated into a main operational amplifier 1A (MOS transistor used in the operational amplifier 1 of FIG. 3) and a sub-operational amplifier 1B (MOS transistors $M_{P3a}$, $M_{P4a}$, $M_{P7a}$; $M_{N3a}$, $M_{N4a}$, $M_{N6a}$). In this case, the main operational amplifier 1A has the role of securing the gain, and the sub-operational amplifier 1B has the role of achieving speedup.

Although one example of the operational amplifier circuit is shown as one differential amplifier circuit in each of the aforementioned preferred embodiments and modified preferred embodiments, the present invention is not limited to this. It is acceptable to constitute a differential amplifier circuit that includes a differential pair circuit or constitute a differential amplifier circuit of, for example, a comparator that includes a differential pair circuit.

IMPLEMENTAL EXAMPLES

The present inventor and others conducted simulations and evaluated the operational amplifier circuit of the preferred embodiment of FIG. 3 by the 0.18-μm standard CMOS process. As comparative circuits, the operational amplifier of one-stage configuration (first prior art) and the existing circuit using the adaptive bias technology (second prior art disclosed in the Non-Patent Document 2) were used. Simulation conditions were a power voltage Vdd of 3.0 V, an input pulse wave of 0.5 to 1.3 $V_{pp}$, and a frequency of 1 kHz. Moreover, phase compensation capacitances for securing stability were $C_{C1}$=146.5 fF, $C_{C2}$=$C_{C3}$=111.2 fF, and $C_L$=988.8 fF.

Figure 14:
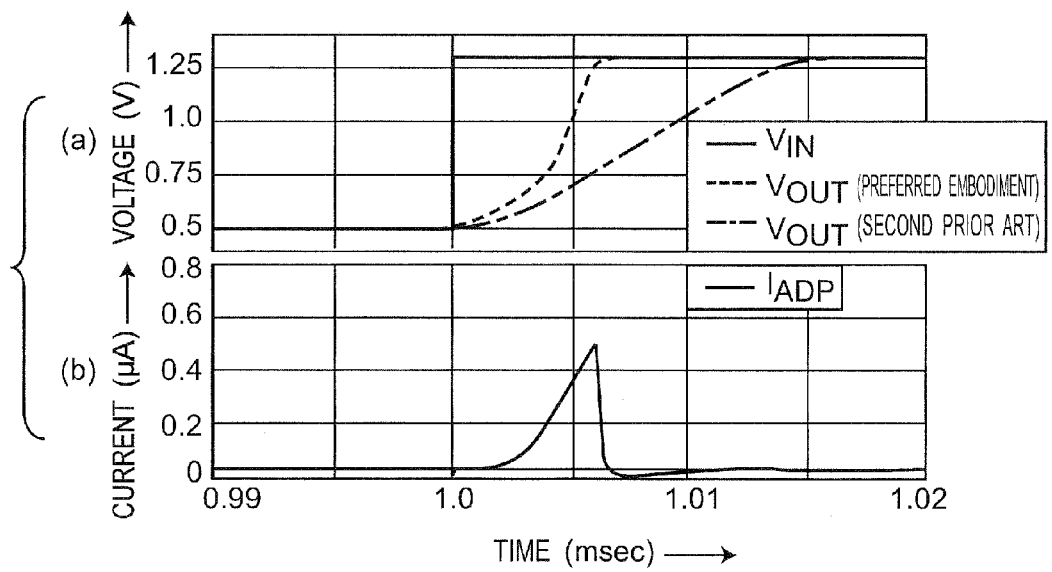
FIG. 14 is (a) a waveform chart showing input and output signal waveforms according to simulation results of the operational amplifier circuits of the preferred embodiment of FIG. 3 and the second prior art, and is (b) a waveform chart showing a current waveform at the above time.

FIG. 14 is (a) a waveform chart showing input and output signal waveforms according to simulation results of the operational amplifier circuits of the preferred embodiment of FIG. 3 and the second prior art, and is (b) a waveform chart showing a current waveform at the time. That is, FIG. 14 shows input and output waveforms and the adaptive bias current $I_{ADP}$ when the operational amplifier circuit of the present preferred embodiment has a unity gain buffer configuration. The figure shows a comparison with the output waveform of the operational amplifier circuit of the second prior art. As apparent from FIG. 14, it can be confirmed that the operational amplifier circuit of the preferred embodiment can achieve a fast response as compared with the second prior art. When the input voltage rises, i.e., when the input voltage $V_{IN+} \neq V_{IN-}$, the adaptive current $I_{ADP}$ is generated, and the output waveform rises concurrently with the current. As a result, it was confirmed that the adaptive current $I_{ADP}$ was generated by the control of the adaptive bias current generator circuit 10 with respect to the fluctuations of the input voltages $V_{IN+}$ and $V_{IN-}$.

Figure 15:
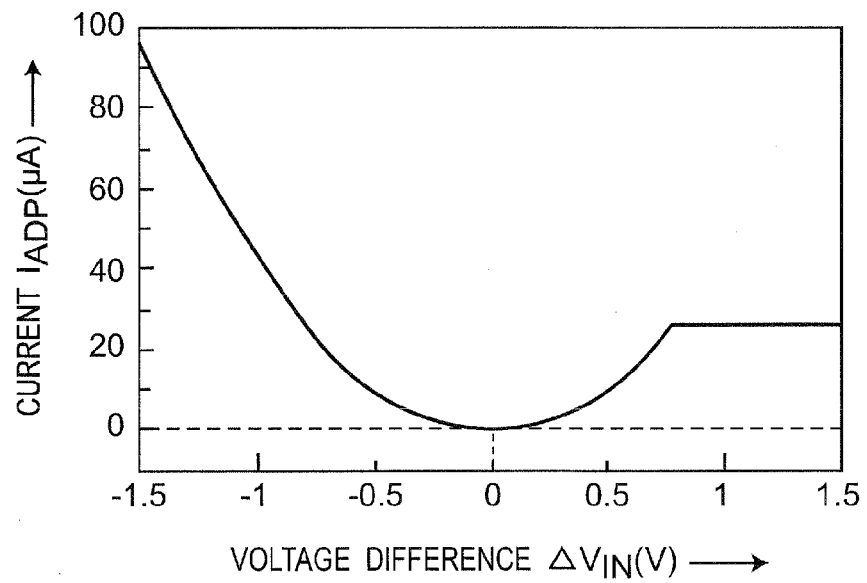
FIG. 15 is a graph showing an adaptive current $I_{ADP}$ with respect to a difference voltage $\Delta V_{IN}$ according to simulation results of the operational amplifier circuit of the preferred embodiment of FIG. 3.

FIG. 15 is a graph showing an adaptive current $I_{ADP}$ with respect to the difference voltage $\Delta V_{IN}$ according to simulation results of the operational amplifier circuit of the preferred embodiment of FIG. 3. That is, FIG. 15 shows a relationship of $I_{ADP}$ with respect to the voltage between the inputs obtained as a result of performing a DC analysis with a reference power voltage of 1.5 V and an input voltage of 0 to 3 V. As apparent from FIG. 15, the adaptive current $I_{ADP}$ increases as the input voltage difference ($\Delta V_{IN}=V_{IN+}-V_{IN-}$) becomes large, and a bias current corresponding to the requirement is generated.

Figure 16:
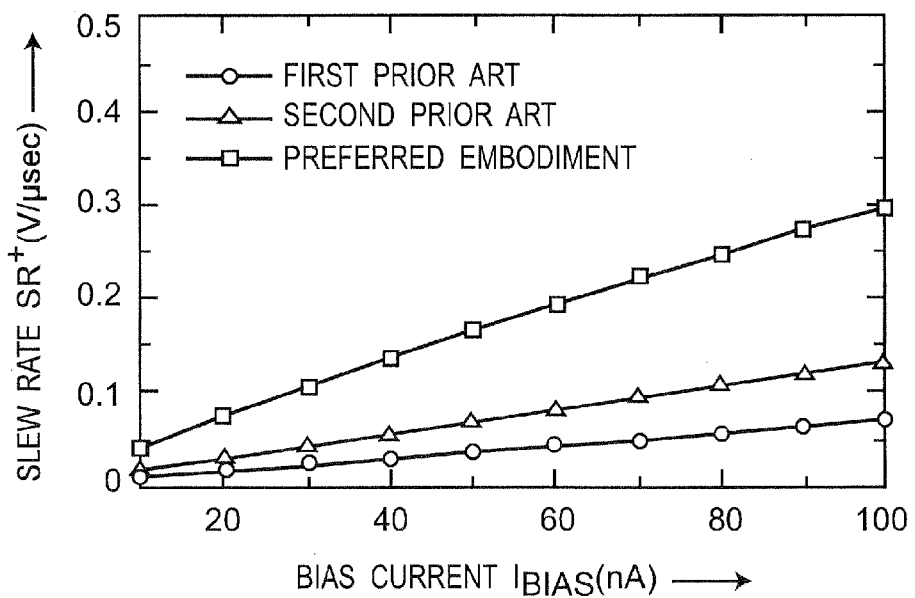
FIG. 16 is a graph showing a rise slew rate $SR^+$ with respect to the bias current $I_{BIAS}$ according to simulation results of the operational amplifier circuits of the preferred embodiment of FIG. 3 and first and second prior arts.
Figure 17:
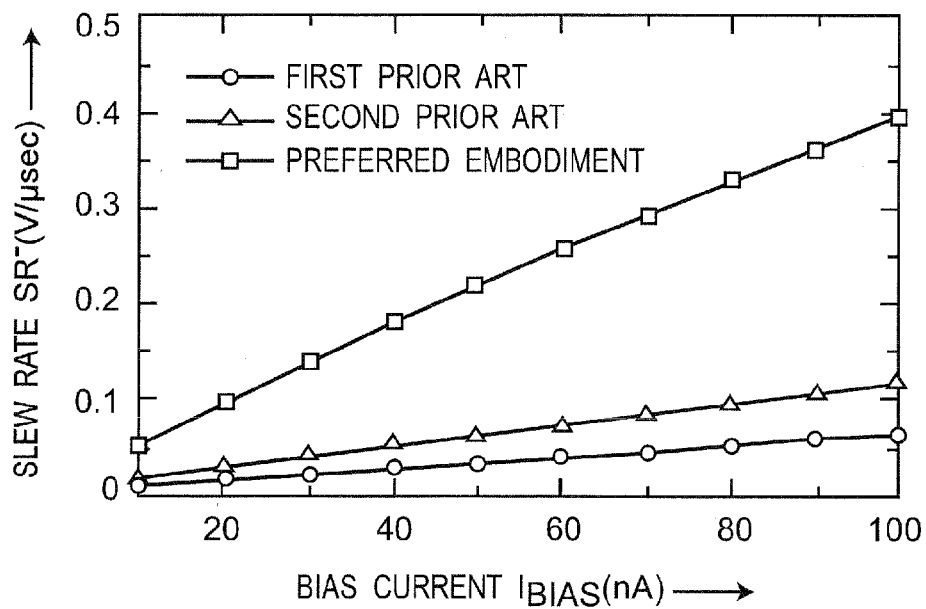
FIG. 17 is a graph showing a fall slew rate $SR^-$ with respect to the bias current $I_{BIAS}$ according to simulation results of the operational amplifier circuits of the preferred embodiment of FIG. 3 and the first and second prior arts.

FIG. 16 is a graph showing a rise slew rate $SR^+$ with respect to the bias current $I_{BIAS}$ according to simulation results of the operational amplifier circuits of the preferred embodiment of FIG. 3 and the first and second prior arts. FIG. 17 is a graph showing a fall slew rate $SR^-$ with respect to the bias current $I_{BIAS}$ according to simulation results of the operational amplifier circuits of the preferred embodiment of FIG. 3 and the first and second prior arts. In this case, the operational amplifier circuit had a unity buffer gain configuration. As apparent from FIGS. 16 and 17, it was confirmed that the slew rates $SR^+$ and $SR^-$ increased in proportion to the bias current in each operational amplifier circuit. The second prior art has about double-speed slew rates $SR^+$ and $SR^-$ compared to those of the first prior art. On the other hand, in the operational amplifier circuit of the present preferred embodiment, speedup of about five times with regard to the slew rate SR⁺ and speedup of about seven times with regard to the slew rate SR⁻ were achieved compared to those of the first prior art.

Figure 18:
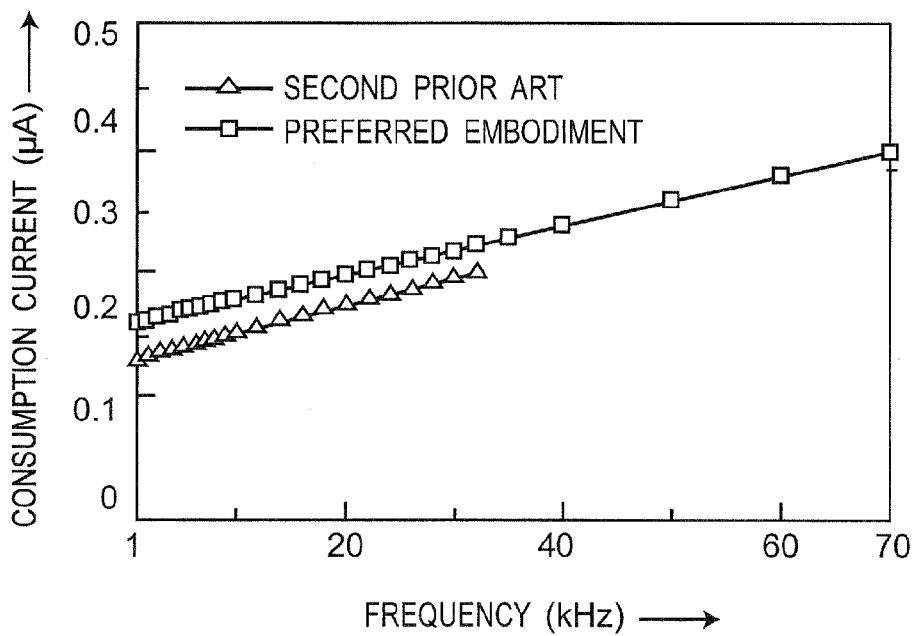
FIG. 18 is a graph showing frequency characteristics of consumption current according to simulation results of the operational amplifier circuits of the preferred embodiment of FIG. 3 and the second prior art.

FIG. 18 is a graph showing frequency characteristics of consumption current according to simulation results of the operational amplifier circuits of the preferred embodiment of FIG. 3 and the second prior art. In this case, since the operational amplifier circuit of the first prior art, which was supplied with a constant current, has no frequency dependence, the present preferred embodiment and the second prior art were compared with each other. As apparent from FIG. 18, in the operational amplifier circuits of the second prior art and the present preferred embodiment, the consumption current increases with an increase in the frequency, exhibiting increases of about 4.4 nA/kHz and 4.0 nA/kHz, respectively. Therefore, the consumption current of the operational amplifier circuit of the present preferred embodiment has low frequency dependence and is operable with a low consumption power even at a high frequency. Moreover, a maximum use frequency $f_{max}$ becomes 32 kHz and 70 kHz in the operational amplifier circuits of the second prior art and the present preferred embodiment, respectively, and the present preferred embodiment can expand more the usable frequency band.

Figure 19:
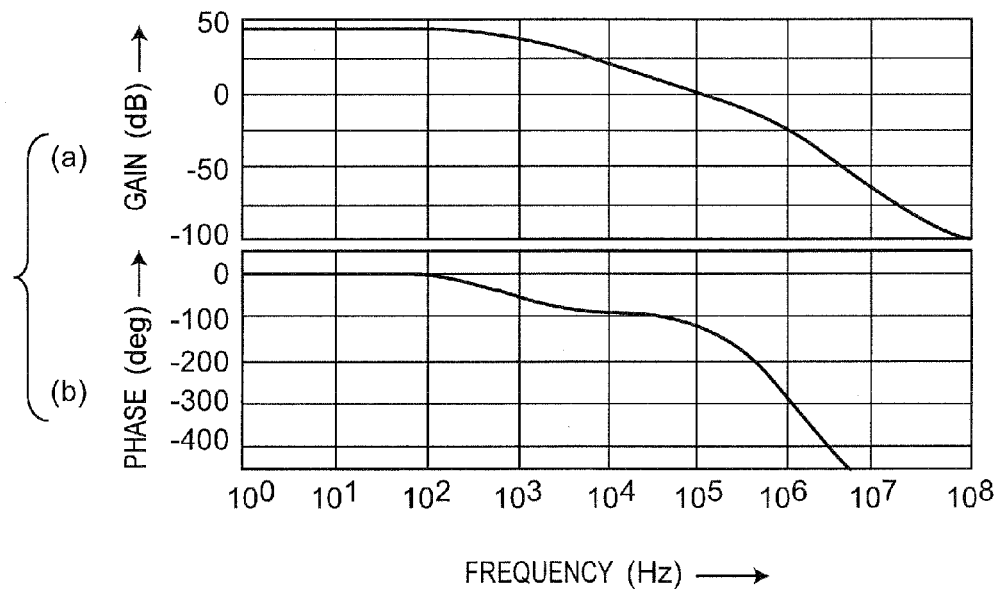
FIG. 19 is a graph showing frequency characteristics (Bode diagrams) of (a) gain and (b) phase of an adaptive bias loop circuit according to simulation results of the operational amplifier circuit of the preferred embodiment of FIG. 3.

FIG. 19 is a graph showing frequency characteristics (Bode diagram) of (a) gain and (b) phase of an adaptive bias loop circuit according to simulation results of the operational amplifier circuit of the preferred embodiment of FIG. 3. That is, the stability of the feedback circuit in the operational amplifier circuit was verified. As apparent from FIG. 19, the gain was 43.9 dB, and the phase margin was 61.3 degrees in the operational amplifier circuit of the present preferred embodiment. With the results, it was confirmed that the operational amplifier circuit of the present preferred embodiment, which secured a phase margin of about 60 degrees, was an operational amplifier circuit of which the stability was guaranteed.

Figure 20:
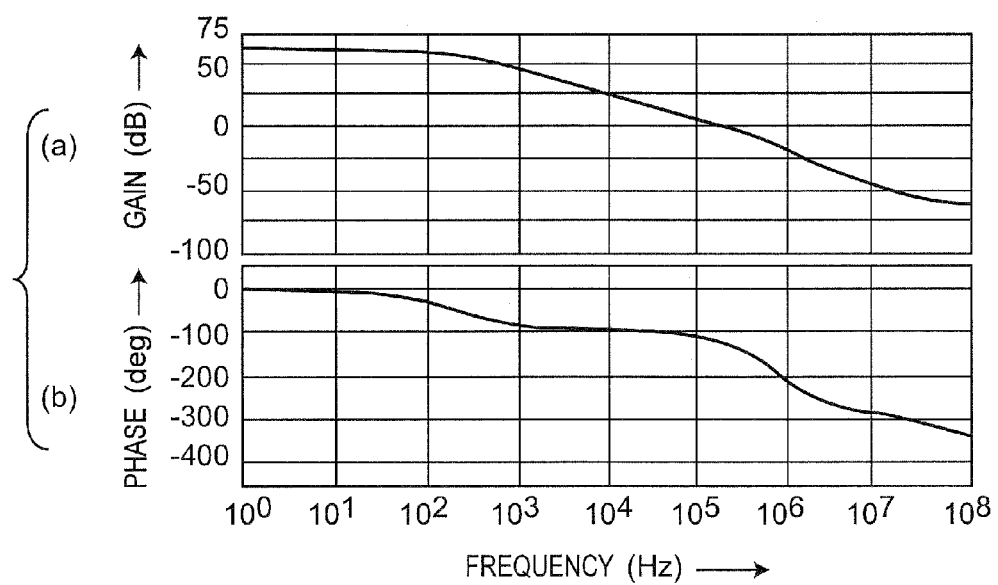
FIG. 20 is a graph showing frequency characteristics (Bode diagram) of (a) gain and (b) phase of the whole operational amplifier circuit according to simulation results of the operational amplifier circuit of the preferred embodiment of FIG. 3.

FIG. 20 is a graph showing frequency characteristics (Bode diagram) of (a) gain and (b) phase of the whole operational amplifier circuit according to simulation results of the operational amplifier circuit of the preferred embodiment of FIG. 3. That is, the stability of the whole operational amplifier circuit was also examined. As apparent from FIG. 20, the gain was 61.5 dB and the phase margin was 57.5 degrees in the operational amplifier circuit of the present preferred embodiment. With the results, the stable operation could be confirmed also with regard to the whole operational amplifier circuit. The gains and the phase margins of the other operational amplifier circuits are shown in FIG. 21.

FIG. 21 is a table showing performance specifications according to the simulation results of the operational amplifier circuits of the preferred embodiment of FIG. 3 and the first and second prior arts. As apparent from FIG. 21, it was confirmed that the operational amplifier circuit of the present preferred embodiment could achieve the operation at high speed with power consumption lower than that of the first and second prior arts.

As described above, according to the ultralow power consumption operational amplifier circuit of the present invention that uses the adaptive bias current generator circuit 10, the adaptive bias current generator circuit 10 monitors the two input voltages, and controls the adaptive bias current by the negative feedback configuration of the differential pair circuit and the adaptive bias current generator circuit 10. In this case, since the adaptive bias current is generated only when the two input voltages do not coincide with each other, the operation can be performed at high speed with low power consumption.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A differential amplifier circuit comprising a differential operational amplifier that includes a differential pair circuit to which differential input voltages are inputted and operates on the basis of a constant bias current supplied from a bias current source circuit, the differential amplifier circuit comprising a bias current generator circuit,
wherein the bias current generator circuit comprises:
a current monitor circuit configured to detect two currents flowing through the differential pair circuit in correspondence with differential input voltages inputted to the differential pair circuit, and detect a minimum current of the two currents with respect to a difference voltage of the differential input voltages as a monitored current;
a current comparator circuit configured to compare the monitored current with the constant bias current supplied from the bias current source circuit, and output a voltage signal corresponding to a comparison result; and
a current amplifier circuit configured to amplify and control the current flowing through the differential pair circuit based on the voltage signal corresponding to the comparison result, and
wherein the bias current generator circuit performs negative feedback adaptive control such that the bias current flowing through the differential pair circuit increases as the monitored current decreases.

2. The differential amplifier circuit as claimed in claim 1,
wherein the current comparator circuit comprises a p-channel MOS transistor and an re-channel MOS transistor that are connected with each other in series,
wherein a fixed bias voltage is applied to one MOS transistor of the p-channel MOS transistor and the n-channel MOS transistor, and a voltage corresponding to the monitored current is applied to another MOS transistor thereof, and
wherein the current comparator circuit generates a voltage corresponding to the comparison result by a voltage at a connection point of the p-channel MOS transistor and the re-channel MOS transistor.

3. The differential amplifier circuit as claimed in claim 1,
wherein the current monitor circuit comprises first and second MOS transistors, which are connected with each other in series,
wherein a voltage corresponding to one current of the two currents of the differential pair circuit is applied to the first MOS transistor, and a voltage corresponding to another current of the two currents of the differential pair circuit is applied to the second MOS transistor, and
wherein the current monitor circuit detects currents flowing through the first and second MOS transistors as monitored currents.

4. The differential amplifier circuit as claimed in claim 3,
wherein the current monitor circuit further comprises third and fourth MOS transistors, which are connected with each other in series and connected in parallel with the circuit of the first and second MOS transistors that are connected with each other in series,
wherein a voltage corresponding to another current of the two currents of the differential pair circuit is applied to the third MOS transistor, and a voltage corresponding to one current of the two currents of the differential pair circuit is applied to the fourth MOS transistor, and wherein the current monitor circuit detects currents flowing through the first and second MOS transistors and currents flowing through the third and fourth MOS transistors as monitored currents.

5. The differential amplifier circuit as claimed in claim 1, wherein the current monitor circuit comprises:

first and second MOS transistors, which are connected with each other in parallel and connected to a first current source of a predetermined bias voltage; and a third MOS transistor connected between the first current source and a second current source of a voltage that is a half of the bias voltage, wherein a voltage corresponding to one current of the two currents of the differential pair circuit is applied to the first MOS transistor, and a voltage corresponding to another current of the two currents of the differential pair circuit is applied to the second MOS transistor, and wherein the current monitor circuit detects a current applied to the third MOS transistor as a monitored current.

6. The differential amplifier circuit as claimed in claim 1, wherein the bias current source circuit operates in a sub-threshold region, and generates a minute bias current.

\* \* \* \* \*